United States Patent
Yang et al.

(10) Patent No.: US 7,313,777 B1
(45) Date of Patent: Dec. 25, 2007

(54) LAYOUT VERIFICATION BASED ON PROBABILITY OF PRINTING FAULT

(75) Inventors: Jie Yang, Sunnyvale, CA (US); Luigi Capodieci, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 211 days.

(21) Appl. No.: 11/194,357

(22) Filed: Aug. 1, 2005

(51) Int. Cl.
 *G06F 17/50* (2006.01)
(52) U.S. Cl. .......................................... 716/10; 716/11
(58) Field of Classification Search .............. 716/8–11, 716/19
 See application file for complete search history.

(56) References Cited

U.S. PATENT DOCUMENTS

| | | | |
|---|---|---|---|
| 6,171,731 B1 * | 1/2001 | Medvedeva et al. | 430/5 |
| 6,263,299 B1 * | 7/2001 | Aleshin et al. | 703/5 |
| 6,738,859 B2 * | 5/2004 | Liebchen | 716/19 |
| 6,976,240 B2 * | 12/2005 | Chang | 716/19 |
| 7,043,071 B2 * | 5/2006 | Qian et al. | 382/144 |
| 2002/0166107 A1 * | 11/2002 | Capodieci et al. | 716/19 |

OTHER PUBLICATIONS

E. Sahouria et al.; *Full-chip Process Simulation for Silicon DRC*; Technical Proceedings of the 2000 International Conference on Modeling and Simulation of Microsystems; 2000; pp. 32-35.

John Randall et al.; *Variable Threshold Resist Models for Lithography Simulation*; Part of the SPIE Conference on Optical Microlithography XII; SPIE vol. 3679; Mar. 1999; pp. 176-182.

L. Capodieci et al.; *Toward a Methodology for Manufacturability-Driven Design Rule Exploration*; DAC; Jun. 7-11, 2004; all.

Efunda engineering fundamentals; *Multiple Regression*; http://www.efunda.com/math/leastsquares/lstsgrzrwtxyld.cfm; Jun. 15, 2005; pp. 1-2.

* cited by examiner

*Primary Examiner*—Jack Chiang
*Assistant Examiner*—Binh Tat
(74) *Attorney, Agent, or Firm*—Timothy M. Honeycutt

(57) ABSTRACT

Methods and apparatus for checking layouts of circuit features are provided. In one aspect, a method of designing a layout for a circuit feature is provided that includes deriving a function which relates a size and a plurality of aerial image parameters of the circuit feature to a probability of a printing fault in using a lithographic process to pattern the circuit feature. A layout for the circuit feature is created. The function is used to determine a probability of a printing fault in using the lithographic process to pattern the circuit feature and adjust the layout of the circuit feature as necessary in view of the determined probability of printing fault.

30 Claims, 4 Drawing Sheets

LAYOUT VERIFICATION BASED ON PROBABILITY OF PRINTING FAULT

BACKGROUND OF THE INVENTION

1. Field of the Invention

This invention relates generally to semiconductor processing, and more particularly to methods an apparatus of examining device layouts for potential printing errors.

2. Description of the Related Art

The translation of a logic design into an actual integrated circuit requires the creation of a circuit layout. Normally layout creation begins with the assembly of a plurality of smaller logic cells into progressively larger and complex structures. Often, standard logic cells are used at this stage. When the layout is complete, a set of reticles is fabricated to print the layout on a wafer using lithography processing.

Design rules are used as a bridge between the layout and the fabricated circuit. The goal of any design rule is to ensure the printability of the structures specified in the layout. Accordingly, layouts typically undergo one or more design rule checks prior to tape-out and reticle fabrication. Not surprisingly, there is a constant tension between the need for higher packing density and acceptable device yields. Conventional design rules are developed based on experimental data obtained from design, fabrication and metrology on a set of test structures. Conventional design rules are generated at an early stage of process development and are used as guidelines for successive layout designs. They are typically expressed as dimensional constraints over layout geometries and their purpose is to guarantee high yield in a production environment. Many conventional rules apply a simple binary decision to a given feature of a layout. If the feature is, say larger than the applicable design rule, then the feature is deemed to pass. Conversely, if the feature is smaller than the minimum specified by the design rule, then the feature is flagged as a failure.

In the sub-wavelength lithography regime, the binary nature of conventional design rules can sometimes not sufficiently predict printing faults or result in larger spacings than actually necessary. There can be an attendant penalty in packing density. Design Rules are often set in a pessimistic way to guarantee a high yield under all circumstances of process and design environment. But with technology scaling, a simple design rule set can no longer find a balance between performance (as a correlate to area) and yield and therefore more and more rules are added in order to capture the impact of different design environment. As a result the complexity of design rules checks is dramatically increased and so is the total number of these checks. In order to limit the proliferation of design rules, the concept of restrictive design rules is introduced. Restrictive design rules aim at even more conservative dimensional constraints in order to ensure high yield. The use of restrictive design rules though, has a negative side effect of greatly increasing the layout area to implement a given design.

The present invention is directed to overcoming or reducing the effects of one or more of the foregoing disadvantages.

SUMMARY OF THE INVENTION

In accordance with one aspect of the present invention, a method of designing a layout for a circuit feature is provided that includes deriving a function which relates a size and a plurality of aerial image parameters of the circuit feature to a probability of a printing fault in using a lithographic process to pattern the circuit feature. A layout for the circuit feature is created. The function is used to determine a probability of a printing fault in using the lithographic process to pattern the circuit feature and adjust the layout of the circuit feature as necessary in view of the determined probability of printing fault.

In accordance with another aspect of the present invention, a method of designing a layout for a circuit feature is provided. The method includes deriving a first function which relates a size and a plurality of aerial image parameters of a first circuit feature to a probability of a printing fault in using a lithographic process to pattern the first circuit feature. A second function is derived which relates a size and a plurality of aerial image parameters of a second circuit feature to a probability of a printing fault in using a lithographic process to pattern the second circuit feature. The first and second functions are combined to yield a third function. A layout is created for the circuit feature. The third function is used to determine a probability of a printing fault in using a lithographic process to pattern the circuit feature and adjust the layout of the circuit feature as necessary in view of the determined probability of printing fault.

In accordance with another aspect of the present invention, an apparatus is provided that includes a computer and an instruction set associated with the computer to cause the computer to examine a layout of a circuit feature by using a function to determine a probability of a printing fault in using a lithographic process to pattern the circuit feature. The function relates a size and a plurality of aerial image parameters of the circuit feature to the probability of a printing fault in using a lithographic process to pattern the circuit feature.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
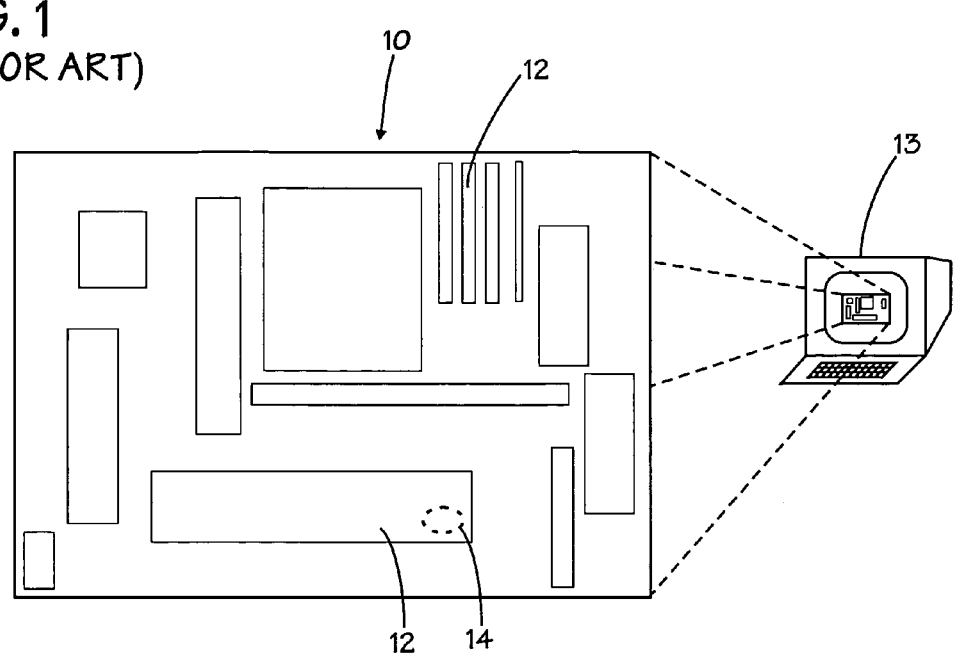
FIG. 1 is a low-magnification plan view of a graphical representation of an exemplary conventional layout of an integrated circuit.

In the drawings described below, reference numerals are generally repeated where identical elements appear in more than one figure. Turning now to the drawings, and in particular to FIG. 1, therein is shown a low-magnification plan view of a graphical representation of an exemplary conventional layout of an integrated circuit 10. The layout 10 includes multitudes of different types of circuit structures, two of which are labeled 12. The layout 10 is a graphical depiction of the intended circuit pattern to be produced following scores of different masking, etching, deposition and other fabrication processes. The layout 10 shown in FIG. 1 is typically constructed using a computer layout tool 13 in which the programmer assembles a number of standard cells or units into larger logic structures. Once assembled, the layout 10 is checked against one or more conventional design rules using another software tool. If the layout 10 satisfies all the conventional design rules, then appropriate reticles are fabricated based on the layout 10 so that the patterns of the layout 10 may be lithographically transferred to a substrate.

Figure 2:
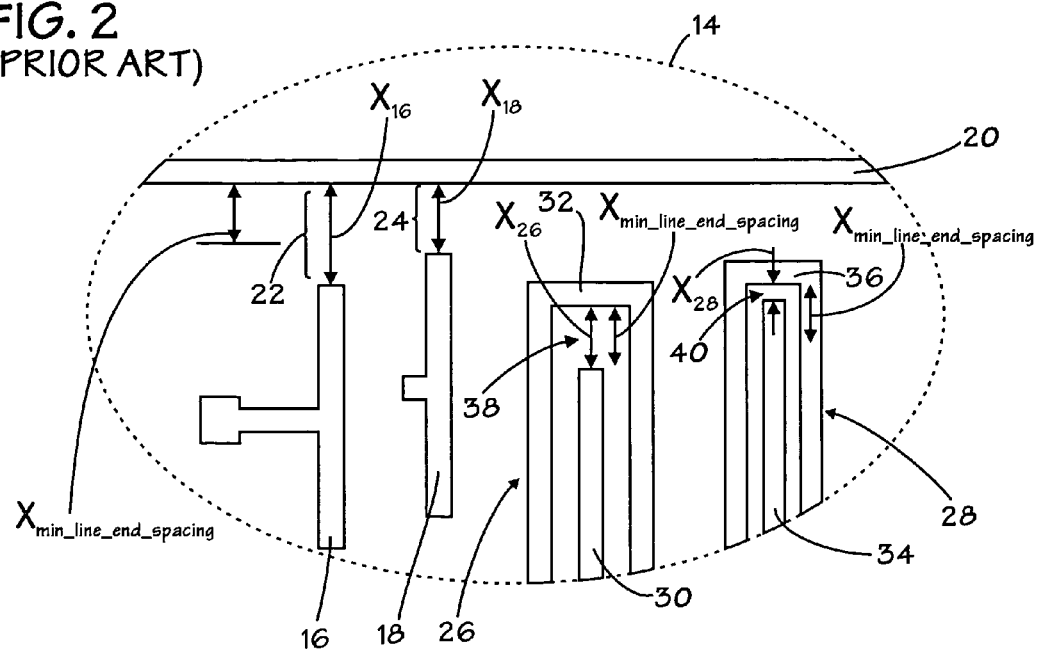
FIG. 2 is a higher magnification view of a portion of FIG. 1.

A small region 14 of the layout 10 is circumscribed by the dashed oval in FIG. 1. The region is shown at a higher magnification in FIG. 2. Attention is now turned additionally to FIG. 2. While the layout 10 shown in FIG. 1 may consist of literally hundreds of millions of different circuit structures, only a few are depicted in FIG. 2 in the circumscribed region 14 for simplicity of illustration. Two classes of circuit structures are depicted in FIG. 2: (1) open-ended structures; and (2) nested-U's. The open-ended category is represented by the circuit structures 16 and 18, which are laid out perpendicularly next to another circuit structure 20 so as to define respective gaps 22 and 24. The circuit structures 16 and 18 are laid out such that their gaps 22 and 24 have respective dimensions $X_{16}$ and $X_{18}$. The nested-U's category is represented by the circuit structures 26 and 28. The nested-U structure 26 consists of a structure 30 nested within a U-shaped structure 32. Similarly, the nested-U structure 28 consists of a structure 34 nested within a U-shaped structure 36. The circuit structures 26 and 28 are laid out so that their respective line ends have gaps 38 and 40 with dimensions $X_{26}$ and $X_{28}$.

Conventional design rule checks are applied to the layouts of the circuit structures 16, 18, 26 and 28. In particular, dimensions $X_{16}$, $X_{18}$, $X_{26}$ and $X_{28}$ are checked against a conventional design rule defined by the distance $X_{min\_line-end\_spacing}$. This type of conventional design rule is binary in nature in that the circuit structures are deemed to pass if the spacings $X_{16}$ and $X_{18}$ are greater than $X_{min\_line-end\_spacing}$ but fail if the converse is true. The same pass/fail analysis is applied to the circuit structures 26 and 28 by comparing spacings $X_{26}$ and $X_{28}$.

In the present illustration, both $X_{16}$ and $X_{26}$ are larger than $X_{min\_line-end\_spacing}$ and thus pass the conventional design rule. However, from the point of view of lithographic fabrication, even the line end associated with $X_{26}$ could be a yield detractor, because of the impact of the surrounding nested-U shape, which would introduce proximity distortions and cause loss of image contrast. This is an example of a conventional Design rule failing to correctly identify a yield limiter.

In contrast, both $X_{18}$ and $X_{28}$ fail the conventional Design rule. Nevertheless, the distance $X_{18}$ could still be used in a layout because there are no surrounding shapes and the risk of yield failure is low. The use of $X_{18}$ would allow a smaller area than $X_{16}$. It is evident that over-constrained design rules practically prevent layout area optimization.

Figure 3:
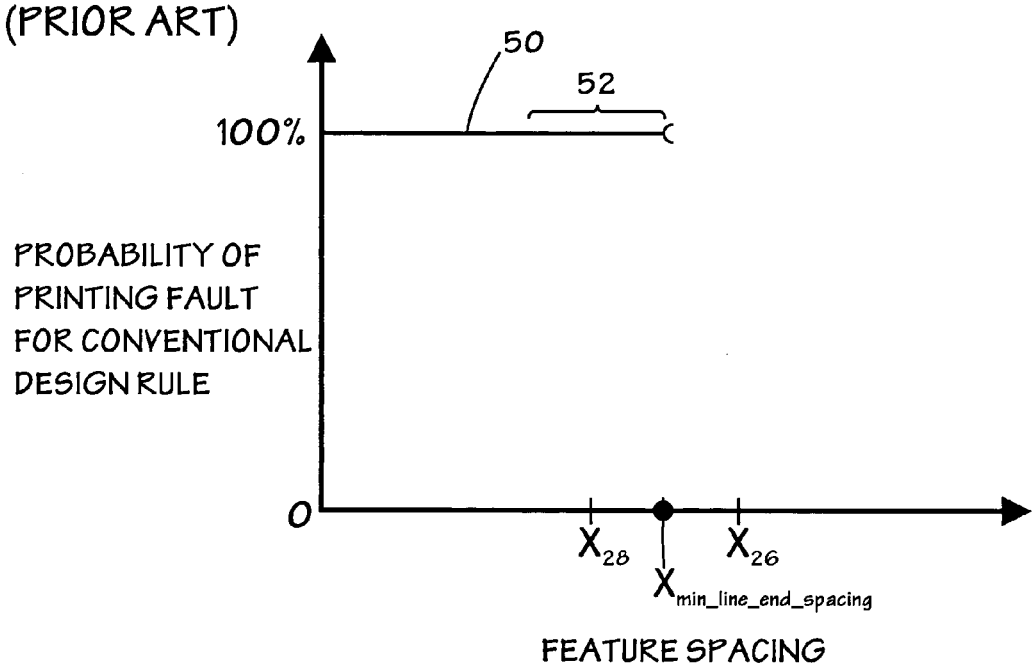
FIG. 3 is a plot of the probability of printing fault for a conventional design rule as a function of feature spacing.
Figure 4:
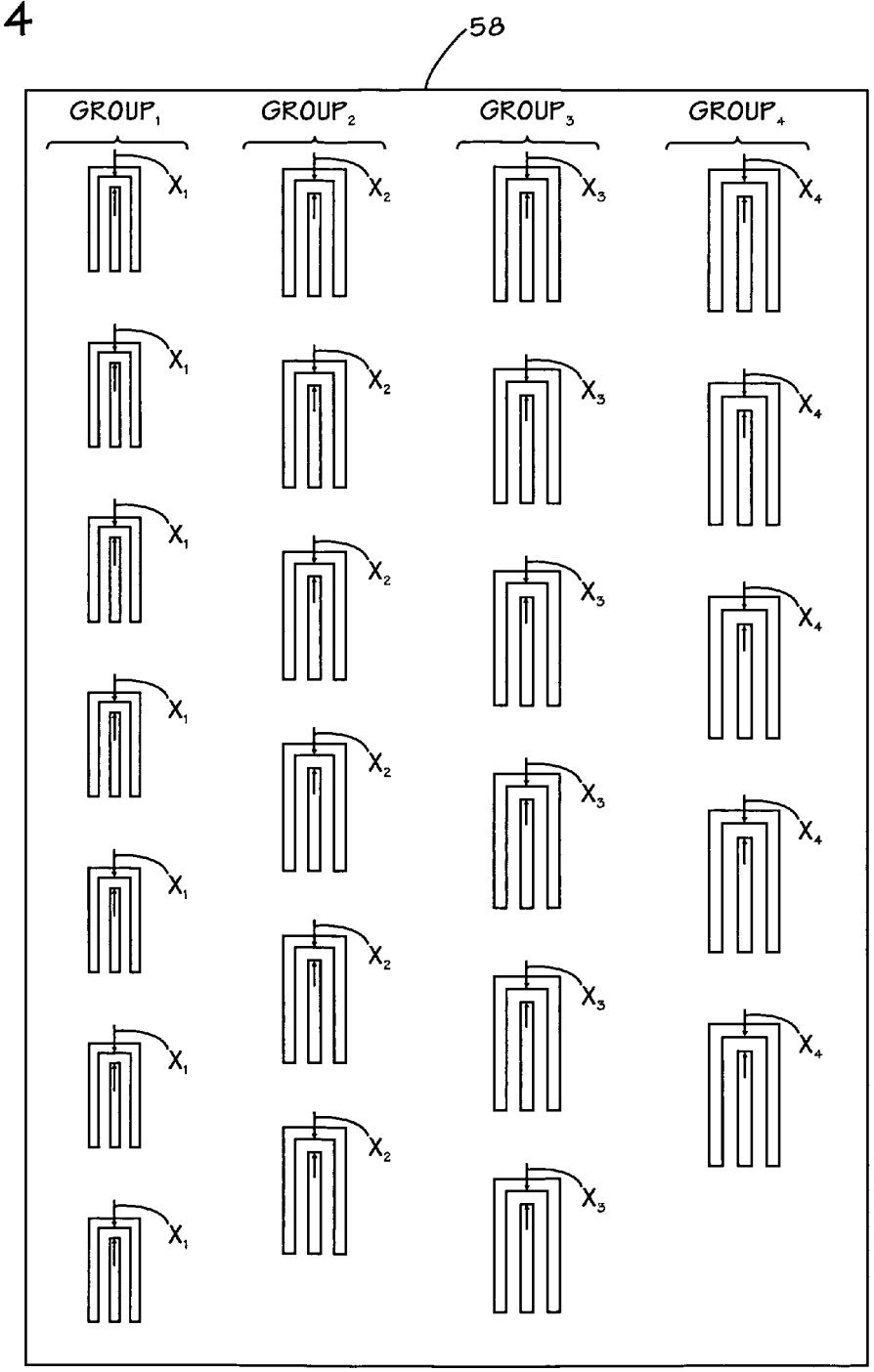
FIG. 4 is a plan view of a test device that may aid in determining the probability of printing fault function in accordance with the present invention.

The sensitivity of the conventional design rule check is depicted graphically in FIG. 3, which shows a plot of the probability of printing fault for a conventional design rule as a function of feature spacing. In this illustration, attention will be focused upon the nested-U's 26 and 28. Note that the conventional design rule $X_{min\_line-end\_spacing}$ is plotted on the X-axis as well as the spacings $X_{26}$ and $X_{28}$. As noted above, the spacing $X_{28}$ is less than $X_{min\_line-end\_spacing}$ and thus by definition yields a 100% probability of print fault. Similarly, the spacing $X_{26}$, which is larger than $X_{min\_line-end\_spacing}$, results in a zero probability of printing fault using the conventional design rule. It may thus be appreciated that the conventional design rule results in what amounts to a step function 50 where the value of the step function is 1.0 or 100% where the feature spacing is less than or equal to $X_{min\_line-end\_spacing}$, and zero where the feature spacing is greater than $X_{min\_line-end\_spacing}$. Of course, the conventional design rule step function is discontinuous at the point where X equals $X_{min\_line-end\_spacing}$.

In contrast to the conventional binary design rule check illustrated graphically in FIG. 3, a new methodology in accordance with the present invention is provided that utilizes a multi-variable approach to characterizing the probability of a printing fault. In particular, a function Z that is continuous (as opposed to a conventional design rule that is discontinuous at at least one point) is determined empirically as described below. The function Z provides an indication of the probability that a given feature layout will result in a printing fault. The function Z is a function of device spacing X, e.g., $X_{26}$, $X_{28}$ etc., and the parameters Imin, Imax and Islope of the aerial image of the device space, again, e.g., $X_{26}$, $X_{28}$ etc., where Imin is the minimum intensity, Imax is the maximum intensity, and Islope is the intensity slope or slope of intensity curve slope taken at the reference threshold of the device space aerial image. The parameters Imin, Imax and Islope are used since those parameters provide a reasonably accurate characterization of the device feature. The function Z has the general form:

$$Z = a + bX + cI_{min} + dI_{max} + eI_{slope} \quad (1)$$

Note that a, b, c, d and e are unknown coefficients, while X, Imin, Imax, Islope and Z are given quantities that are empirically determined as described below. A curve fit is performed to determine the unknown coefficients a, b, c, d and e. A myriad of curve fitting techniques may be used, such as, for example least squares, cubic splines or the like. In an exemplary embodiment, a least squares technique may be used. For a given data set $(X_1, Imin_1, Imax_1, Islope_1, Z_1)$, $(X_2, Imin_2, Imax_2, Islope_2, Z_2) \ldots (X_n, Imin_n, Imax_n, Islope_n, Z_n)$, where $n \geq 4$, the best fitting curve f(X, Imin, Imax, Islope) has the least square error, i.e., $$\Pi \sum_{i=1}^{n} [Zi - f(Xi, Imin, Imax, Islope)]^2 = \quad (2)$$

$$\sum_{i=1}^{n} [Zi - (a + bXi + cImin = dImax + eIslope)]^2 = \min.$$

To obtain the least square error, the unknown coefficients a, b, c, d and e must yield zero first derivatives as follows:

$$\frac{\partial \Pi}{\partial a} = 3 \sum_{i=1}^{n} [Zi - (a + bXi + cImin_i + dImax_i + Islope_i)] = 0 \quad (3)$$

$$\frac{\partial \Pi}{\partial b} = 3 \sum_{i=1}^{n} Xi [Zi - (a + bXi + cImin_i + dImax_i + Islope_i)] = 0 \quad (4)$$

$$\frac{\partial \Pi}{\partial c} = 3 \sum_{i=1}^{n} Imin_i [Zi - (a + bXi + cImin_i + dImax_i + Islope_i)] = 0 \quad (5)$$

$$\frac{\partial \Pi}{\partial d} = 3 \sum_{i=1}^{n} Imax_i [Zi - (a + bXi + cImin_i + dImax_i + Islope_i)] = 0 \quad (6)$$

-continued $$\frac{\partial \Pi}{\partial e} = 3 \sum_{i=1}^{n} Islope_i [Z_i - (a + bX_i + cImin_i + dImax_i + Islope_i)] = 0 \quad (7)$$

An expansion of Equations 3, 4, 5, 6 and 7 yields:

$$\sum_{i=1}^{n} Z_i = a \sum_{i=1}^{n} 1 + b \sum_{i=1}^{n} X_i + c \sum_{i=1}^{n} Imin_i + d \sum_{i=1}^{n} Imax_i + e \sum_{i=1}^{n} Islope_i \quad (8)$$

$$\sum_{i=1}^{n} X_i Z_i = \quad (9)$$

$$a \sum_{i=1}^{n} X_i + b \sum_{i=1}^{n} X_i^2 + c \sum_{i=1}^{n} X_i Imin_i + d \sum_{i=1}^{n} X_i Imax_i + e \sum_{i=1}^{n} X_i Islope_i$$

$$\sum_{i=1}^{n} Imin_i Z_i = a \sum_{i=1}^{n} Imin_i + b \sum_{i=1}^{n} Imin_i X_i + \quad (10)$$
$$c \sum_{i=1}^{n} Imin_i^2 + d \sum_{i=1}^{n} Imin_i Imax_i + e \sum_{i=1}^{n} Imin_i Islope_i$$

$$\sum_{i=1}^{n} Imax_i Z_i = a \sum_{i=1}^{n} Imax_i + b \sum_{i=1}^{n} Imax_i X_i + \quad (11)$$
$$c \sum_{i=1}^{n} Imax_i Imin_i + d \sum_{i=1}^{n} Imax_i^2 + e \sum_{i=1}^{n} Imax_i Islope_i$$

$$\sum_{i=1}^{n} Islope_i Z_i = a \sum_{i=1}^{n} Islope_i + b \sum_{i=1}^{n} Islope_i X_i + \quad (12)$$
$$c \sum_{i=1}^{n} Islope_i Imin_i + d \sum_{i=1}^{n} Islope_i Imax_i + e \sum_{i=1}^{n} Islope_i^2$$

The unknown coefficients a, b, c, d and e can be obtained by solving the linear equations (8)-(12) using well-known arithmetic techniques for solving systems of linear equations.

In order to perform the above-described curve fit to obtain the function Z, a data set $(X_1, Imin_1, Imax_1, Islope_1, Z_1)$, $(X_2, Imin_2, Imax_2, Islope_2, Z_2)$ . . . $(X_n, Imin_n, Imax_n, Islope_n, Z_n)$ must first be acquired. The skilled artisan will appreciate that a given data set will differ from another depending on various parameters associated with the lithography process, such as the resist type, the exposure wavelength, the exposure energy, the numerical aperture of the exposure lens or other parameters. Such parameters are largely matters of design discretion. In one exemplary embodiment, positive tone resist with chemical amplification may be used with an exposure wavelength of 193 nm, an exposure energy of about 12 to 20 mJ and a lens with a numerical aperture of about 0.7 to 0.8.

Figure 5:
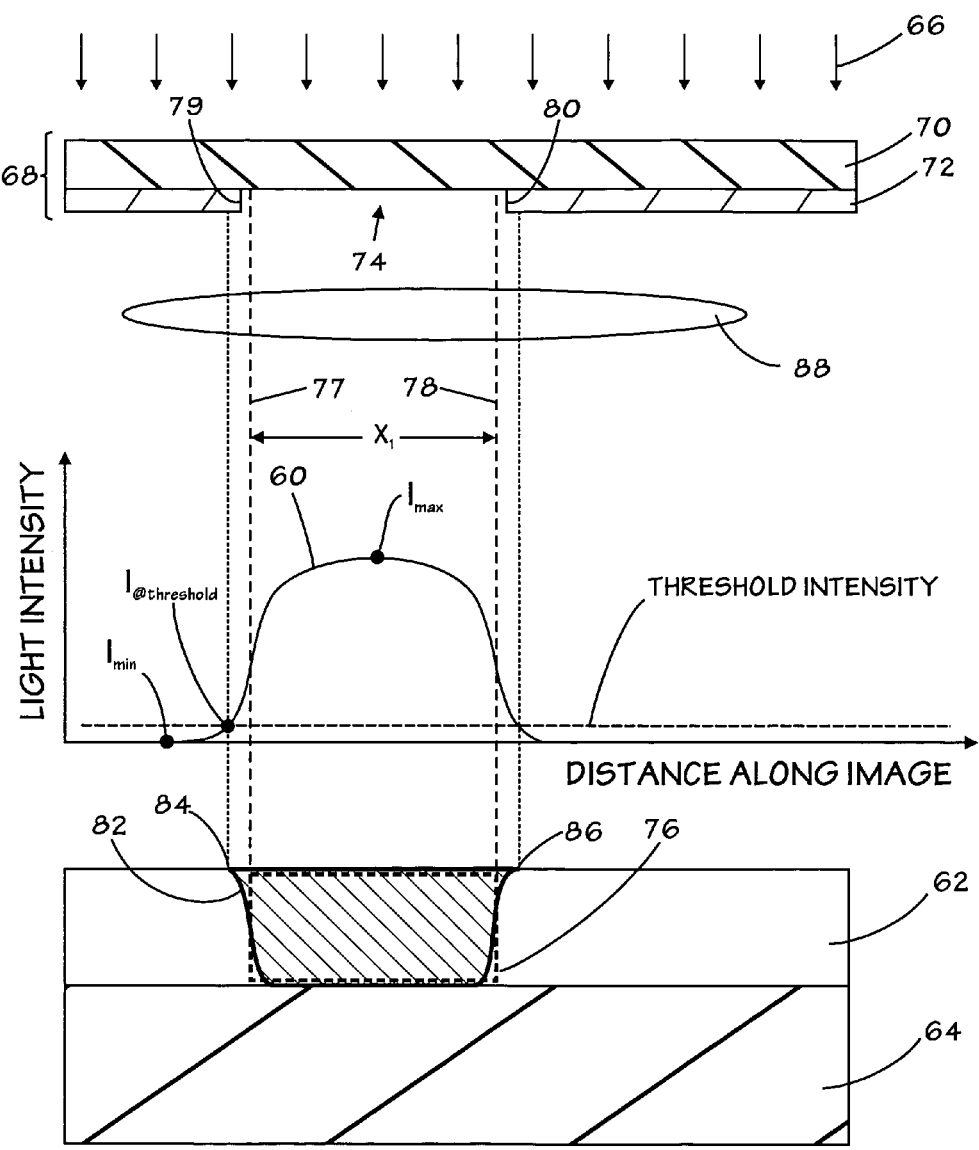
FIG. 5 is a cross-section view of a structure undergoing lithographic exposure with an aerial image overlaid thereon in accordance with the present invention.

The determination of the data set will now be described in conjunction with FIG. 5. To obtain values for $X_1, X_2, \ldots X_n$, and $Z_1, Z_2, \ldots Z_n$, a test device 58 is fabricated with a layout that includes multiple populations of a particular feature. There may be populations of one or more of the myriad of different features used in integrated circuit layouts. In this simple illustration, the device 58 is provided with multiple populations of nested-U's, designated $Group_1$, $Group_2$, $Group_3$ and $Group_4$. The individual nested-U's in each of the groups: $Group_1$, $Group_2$, $Group_3$ and $Group_4$ are fabricated with a particular feature size. Thus, the nested-U's in $Group_1$ are fabricated with a feature size $X_1$, the nested-U's in $Group_2$ with a feature size $X_2$, those in $Group_3$ with a feature size $X_3$ and those in $Group_4$ with a feature size $X_4$. The value of $X_1$, the smallest of the represented nested-U sizes, may be tied to the minimum device geometry for currently available lithography processes. However this is not required. The feature sizes $X_2$, $X_3$ and $X_4$ may, but need not be integer multiples of $X_1$.

The nested-U's of $Group_1$, $Group_2$, $Group_3$ and $Group_4$ are next subjected to failure analysis. The failure analysis may be performed in a variety of ways. In one exemplary embodiment, metrology measurements of the dimensions of the printed features of $Group_1$, $Group_2$, $Group_3$ and $Group_4$ on the test device 58 may be made and checked for printing errors. Optionally, some or all of the nested-U's of $Group_1$, $Group_2$, $Group_3$ and $Group_4$ may be fabricated as part of active circuit devices that may be electrically verified using probe testing or other electrical verification tests to find any device failures. The number of printing devices in a group, say, $Group_1$, which have a printing error is divided by the total number of devices in $Group_1$ to yield a value failure rate of between zero and one. This failure rate is set equal to $Z_1$ for $Group_1$. The same procedure is followed for $Group_2$, $Group_3$ and $Group_4$ to yield failure rate values $Z_2$, $Z_3$ and $Z_4$.

To obtain values for $(Imin_1, Imax_1, Islope_1)$, $(Imin_2, Imax_2, Islope_2)$, $(Imin_3, Imax_3, Islope_3)$, $(Imin_4, Imax_4, Islope_4)$ and thus round out the data set $(X_1, Imin_1, Imax_1, Islope_1, Z_1)$, $(X_2, Imin_2, Imax_2, Islope_2, Z_2)$, $(X_3, Imin_3, Imax_3, Islope_3, Z_3)$, $(X_4, Imin_4, Imax_4, Islope_4, Z_4)$ necessary to compute the function Z, an aerial image 60 of the type depicted in FIG. 6 is determined for a representative feature from each of groups: $Group_1$, $Group_2$, $Group_3$ and $Group_4$. The aerial image 60 may be determined using well-known lithography simulation tools, such as, for example, Calibre by Mentor Graphics, Inc., Prolitz by KLA-Tencor or Em Suite by Panoramic Technology. Optionally, the aerial image parameters may be determined under actual lab conditions. If actual lab conditions are used, and assuming that it is desired to produce the spacing $X_1$, a resist coating 62 positioned on a test substrate 64 may be exposed by projecting actinic radiation 66 through a suitable reticle 68 that consists of a transparent substrate 70 and various opaque structures 72. The pattern of the opaque structures 72 will define an aperture 74 corresponding to the desired layout of the gap with size $X_1$ as represented by the dashed box 76. The edges of the desired layout 76 are represented by the dashed lines 77 and 78. Note that the edges 79 and 80 of the opaque structure 72 may be pulled back slightly from the edges 77 and 78 in order to provide optical proximity correction. The actual shape of the region 82 of the resist mask 62 that is exposed has the generally sloped-walled shape as shown. The left and right edges 84 and 86 of the region 82 are demarcated by the points where the intensity is at the intensity threshold $I_{@THRESHOLD}$. It should be noted that the actinic radiation 66 may be passed through one or more lenses 88. The skilled artisan will also appreciate that the reticle 68 will typically have plural openings suitable to print features with sizes $X_2$, $X_3$ and $X_4$ necessary to complete the data set $(X_1, Imin_1, Imax_1, Islope_1, Z_1)$, $(X_2, Imin_2, Imax_2, Islope_2, Z_2)$, $(X_3, Imin_3, Imax_3, Islope_3, Z_3)$, $(X_4 Imin_4, Imax_4, Islope_4, Z_4)$.

With the data set in hand, the above-described curve fit is performed to yield the function Z, which provides a value between 0 and 1 that is predictive of printing fault. The skilled artisan will appreciate that values of Z closer to 0 represent higher risk of printing fault. Conversely, values of Z closer to 1 represent lower risk of printing fault. The designer can work flexibly with layouts that fall in the range of Z closer to 1 and reap a potential savings in chip area.

The layout designer can produce an initial layout for a given circuit feature. Thereafter, the designer can use the function Z to check the initial layout for a probability of printing fault. If the probability is deemed sufficiently low, then the layout can proceed as is. If, however, the probability of printing fault is deemed to high, then the layout designer can modify the layout as necessary to decrease the probability of printing fault.

The technique described thus far provides a function Z appropriate for a particular type of feature, e.g., nested-U, open-ended line, etc. However, the method may also be applied on a more global basis that includes multiple types of features. In this regard, a function Z (see Equation 1 above) for each type of feature, e.g., nested-U, open-ended line, etc. is determined using the technique described above to yield a set of functions ($Z_a$, $Z_b$ ... $Z_n$). Thus, the function $Z_a$ might be the function Z obtained for the nested-U's described above, and the function $Z_b$ might be a corresponding function for open-ended lines, and so on. A global function $Z_{global}$ for the plurality of features may be determined from:

$$Z_{global} = \sum_{i=1}^{n} \frac{WnZi}{n} \quad (13)$$

where $W_n$ is a weighting factor selected for each type of structural, e.g., nested-U, open-ended line, etc. The weighting factor $W_n$ is designed to compensate for, among other things, differences in the numbers of features in a given layout and the known propensity for a give type of feature to exhibit greater than average risk of printing faults. The weighting factor $W_n$ may be based on a variety of factors, such as the percentage population count of a type of feature, e.g., nested-U's, versus all other structures in a given layout, experience with printing failures for a set of structures or other factors. The function $Z_{global}$ may be used to predict the probability of printing fault for circuit features that do not fit neatly into one category or another.

A given layout may be created using known techniques, such as assembly of standard cells using a layout computer tool. Layout verification may then be performed using a computer, such as the computer 13 represented schematically in FIG. 1. The term "computer" includes computers, microprocessors, application specific integrated circuits or the like. The computer 13 may be supplied with an appropriate instruction set that is operable to cause the computer 13 to use the function Z from Equation 1 to determine a probability of printing fault associated with the multiple examples of a given feature in a given layout. The computer 13 may also be used to perform a suitable curve fit. The instruction set may be implemented in virtually any programming language and in any form. Those circuit features that are identified as having have a value of Z that is deemed too high for acceptable device yields may be flagged for layout modification as necessary.

Other applications are contemplated. For example, the actual design and verification of reticles, with or without optical proximity corrections and phase shifting regions, may be performed using the present technique. Optionally, the design and verification of standard cells for layout tools may be done using the present invention.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed:

1. A method of designing a layout for a circuit feature, comprising:
   deriving a function which relates a size and a plurality of aerial image parameters of the circuit feature to a probability of a printing fault in using a lithographic process to pattern the circuit feature;
   creating a layout for the circuit feature; and
   using the function to determine a probability of a printing fault in using the lithographic process to pattern the circuit feature and adjusting the layout of the circuit feature as necessary in view of the determined probability of printing fault, and wherein the function is determined by patterning a plurality of the circuit features wherein each of the plurality of circuit features has a different size and a correspondingly different plurality of aerial image parameters, measuring the actual printing fault rates for the plurality of circuit features, and applying a curve fit to a data set that includes the plurality of sizes, the plurality of aerial image parameters and the plurality of actual printing fault rates of the plurality of circuit features.

2. The method of claim 1, wherein the plurality of aerial image parameters comprises minimum intensity, maximum intensity and intensity slope.

3. The method of claim 2, wherein the plurality of aerial image parameters are determined by measurement.

4. The method of claim 1, wherein the plurality of aerial image parameters are determined by simulation.

5. The method of claim 4, wherein the simulation is performed by computer.

6. The method of claim 1, wherein the lithographic process comprises an optical lithography process.

7. The method of claim 1, wherein the measuring of the actual printing fault rate comprises visual inspection of the plurality of circuit features.

8. The method of claim 1, wherein the measuring of the actual printing fault rate comprises electrical testing of the plurality of circuit features.

9. The method of claim 1, wherein the application of the curve fit comprises applying a least squares curve fit.

10. The method of claim 1, wherein the creation of the layout and the using the function to predict a probability of a printing fault are performed by computer.

11. The method of claim 1, comprising creating a reticle to pattern the circuit feature, the reticle having an image of the circuit feature, the image being adjusted as necessary in view of the determined probability of printing fault.

12. A method of designing a layout for a circuit feature, comprising:
    deriving a first function which relates a size and a plurality of aerial image parameters of a first circuit feature to a probability of a printing fault in using a lithographic process to pattern the first circuit feature, and wherein the first function is determined by patterning a plurality of the first circuit features wherein each of the plurality of first circuit features has a different size and a correspondingly different plurality of aerial image parameters, measuring the actual printing fault rates for the plurality of first circuit features, and applying a curve fit to a data set that includes the plurality of sizes, the plurality of aerial image parameters and the plurality of actual printing fault rates of the plurality of first circuit features;

deriving a second function which relates a size and a plurality of aerial image parameters of a second circuit feature to a probability of a printing fault in using a lithographic process to pattern the second circuit feature;

combining the first and second functions to yield a third function;

creating a layout for the circuit feature; and using the third function to determine a probability of a printing fault in using a lithographic process to pattern the circuit feature and adjusting the layout of the circuit feature as necessary in view of the determined probability of printing fault.

13. The method of claim 12, wherein the pluralities of aerial image parameters of the first and second circuit features each comprise minimum intensity, maximum intensity and intensity slope.

14. The method of claim 12, wherein the pluralities of aerial image parameters of the first and second circuit features are each determined by simulation.

15. The method of claim 14, wherein the simulation is performed by computer.

16. The method of claim 12, wherein the pluralities of aerial image parameters of the first and second circuit features are each determined by measurement.

17. The method of claim 12, wherein the lithographic process comprises an optical lithography process.

18. The method of claim 12, wherein the second function is determined by patterning a plurality of the second circuit features wherein each of the plurality of second circuit features has a different size and a correspondingly different plurality of aerial image parameters, measuring the actual printing fault rates for the plurality of second circuit features, and applying a curve fit to a data set that includes the plurality of sizes, the plurality of aerial image parameters and the plurality of actual printing fault rates of the plurality of second circuit features.

19. The method of claim 12, wherein the creation of a layout and the using the function to predict a probability of a printing fault are performed by computer.

20. The method of claim 12, comprising creating a reticle to pattern the circuit feature, the reticle having an image of the circuit feature, the image being adjusted as necessary in view of the determined probability of printing fault.

21. An apparatus, comprising:

a computer; and an instruction set associated with the computer to cause the computer to examine a layout of a circuit feature by using a function to determine a probability of a printing fault in using a lithographic process to pattern the circuit feature, the function relating a size and a plurality of aerial image parameters of the circuit feature to the probability of a printing fault in using a lithographic process to pattern the circuit feature, and wherein the function is determined by patterning a plurality of the circuit features wherein each of the plurality of circuit features has a different size and a correspondingly different plurality of aerial image parameters, measuring the actual printing fault rates for the plurality of circuit features, and applying a curve fit to a data set that includes the plurality of sizes, the plurality of aerial image parameters and the plurality of actual printing fault rates of the plurality of circuit features.

22. The apparatus of claim 21, wherein the plurality of aerial image parameters comprises minimum intensity, maximum intensity and intensity slope.

23. The apparatus of claim 21, wherein the plurality of aerial image parameters are determined by simulation.

24. The apparatus of claim 23, wherein the simulation is performed by computer.

25. The apparatus of claim 21, wherein the plurality of aerial image parameters are determined by measurement.

26. The apparatus of claim 21, wherein the lithographic process comprises an optical lithography process.

27. The apparatus of claim 21, wherein the measuring of the actual printing fault rate comprises visual inspection of the plurality of circuit features.

28. The apparatus of claim 21, wherein the measuring of the actual printing fault rate comprises electrical testing of the plurality of circuit features.

29. The apparatus of claim 21, wherein the application of the curve fit comprises applying a least squares curve fit.

30. The apparatus of claim 21, wherein the application of the curve fit is performed by computer.

* * * * *